United States Patent
Lu et al.

(10) Patent No.: US 10,089,729 B2
(45) Date of Patent: Oct. 2, 2018

(54) MERGING MAGNETIC RESONANCE (MR) MAGNITUDE AND PHASE IMAGES

(71) Applicant: TOSHIBA MEDICAL SYSTEMS CORPORATION, Tochigi (JP)

(72) Inventors: Aiming Lu, Vernon Hills, IL (US); Mitsue Miyazaki, Des Plaines, IL (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 625 days.

(21) Appl. No.: 14/120,073

(22) Filed: Apr. 23, 2014

(65) Prior Publication Data
US 2015/0310650 A1    Oct. 29, 2015

(51) Int. Cl.
| | |
|---|---|
| G06K 9/40 | (2006.01) |
| G06T 5/00 | (2006.01) |
| G01R 33/56 | (2006.01) |
| G06T 11/00 | (2006.01) |
| G06T 19/20 | (2011.01) |
| G01R 33/54 | (2006.01) |

(52) U.S. Cl.
CPC .......... *G06T 5/009* (2013.01); *G01R 33/5608* (2013.01); *G06T 11/001* (2013.01); *G06T 19/20* (2013.01); *G01R 33/546* (2013.01); *G06T 2210/41* (2013.01); *G06T 2219/2012* (2013.01)

(58) Field of Classification Search
None
See application file for complete search history.

(56) References Cited

U.S. PATENT DOCUMENTS

| | | | | |
|---|---|---|---|---|
| 5,410,250 | A * | 4/1995 | Brown | G01R 33/56 324/309 |
| 5,652,513 | A * | 7/1997 | Liu | G01R 33/563 324/306 |
| 6,115,485 | A * | 9/2000 | Dumoulin | G01S 7/52034 382/128 |
| 7,116,105 | B1 * | 10/2006 | Zhang | G01R 33/5613 324/307 |
| 7,288,937 | B2 * | 10/2007 | Nabetani | G01R 33/3415 324/307 |
| 7,764,814 | B2 * | 7/2010 | Fayad | A61B 5/055 382/128 |

(Continued)

OTHER PUBLICATIONS

Aoki et al, Velocity-Coded Color MR Angiography, AJNR Am J Neuroradiol 19:691-693, Apr. 1998.*

(Continued)

*Primary Examiner* — Andrae S Allison
(74) *Attorney, Agent, or Firm* — Nixon & Vanderhye P.C.

(57) ABSTRACT

A magnetic resonance imaging (MRI) system, process, display processing system and/or computer readable medium with stored program code structure thereon is configured to provide for obtaining a composite image which simultaneously includes information from a magnitude MR image and a phase MR image. The composite image is generated by assigning a first color display channel to the magnitude MR image and a second color display channel to the phase MR image, and generating the composite image by assigning to respective pixels in the composite image color values based upon a combination of corresponding pixels in the assigned first and second color display channels.

16 Claims, 9 Drawing Sheets

(56) References Cited

U.S. PATENT DOCUMENTS

| | | | | |
|---|---|---|---|---|
| 2005/0190955 A1* | 9/2005 | Brown | G01R 33/56 | 382/128 |
| 2007/0053554 A1* | 3/2007 | Fayad | A61B 5/055 | 382/128 |
| 2011/0044524 A1* | 2/2011 | Wang | G01R 33/54 | 382/131 |
| 2012/0263362 A1* | 10/2012 | McAuley | G06T 7/0012 | 382/131 |
| 2013/0194265 A1* | 8/2013 | Rehwald | G01R 33/4828 | 345/424 |
| 2015/0241537 A1* | 8/2015 | Dannels | G01R 33/56554 | 324/309 |
| 2015/0310650 A1* | 10/2015 | Lu | G01R 33/5608 | 324/322 |
| 2016/0063738 A1* | 3/2016 | Saito | G01R 33/56316 | 382/131 |

OTHER PUBLICATIONS

Haacke et al, Susceptibility-Weighted Imaging: Technical Aspects and Clinical Applications, Part 1, AJNR Jan. 2009 30: 19-30.*

Brink, DPI Scaling Size—Change for Displays in Windows 8.1, Jul. 15, 2013, https://www.eightforums.com/tutorials/28310-dpi-scaling-size-change-displays-windows-8-1-a.html.*

Vegh et al , Selective Channel Combination of MRI Signal Phase, Magnetic Resonance in Medicine 76:1469-1477 (2016).*

Robinson, Simon Daniel, et al. "An illustrated comparison of processing methods for MR phase imaging and QSM: combining array coil signals and phase unwrapping." NMR in Biomedicine 30.4 (2017).*

Aiming Lu et al, "Improved Slice Selection for R2* Mapping During Cryoablation With Eddy Current Compensation" Journal of Magnetic Resonance Imaging, vol. 28 pp. 190-198 (2008).

Peter Kellman et al, "Phase-Sensitive Inversion Recovery for Detecting Myocardial Infarction Using Gadolinium-Delayed Hyperenhancement," Magnetic Resonance in Medicine Feb. 2002 ; 47(2): pp. 372-383.

E. M. Haacke et al, "Susceptibility-Weighted Imaging: Technical Aspects and Clinical Applications, Part 1," AJNR Am J Neuroradiol 30:19-30 ( Jan. 2009).

Aiming Lu et al, "MRI of Frozen Tissue Demonstrates a Phase Shift," Magnetic Resonance in Medicine 66:1582-1589 (2011).

Michael Carl et al., "Investigations of the Origin of Phase Differences Seen with Ultrashort TE Imaging of Short T2 Meniscal Tissue," Magnetic Resonance in Medicine 67:991-1003 (2012).

* cited by examiner

MERGING MAGNETIC RESONANCE (MR) MAGNITUDE AND PHASE IMAGES

FIELD

The subject matter below relates generally to magnetic resonance imaging (MRI). In particular, the subject matter relates to merging MR magnitude and phase images.

DETAILED DESCRIPTION

Figure 1:
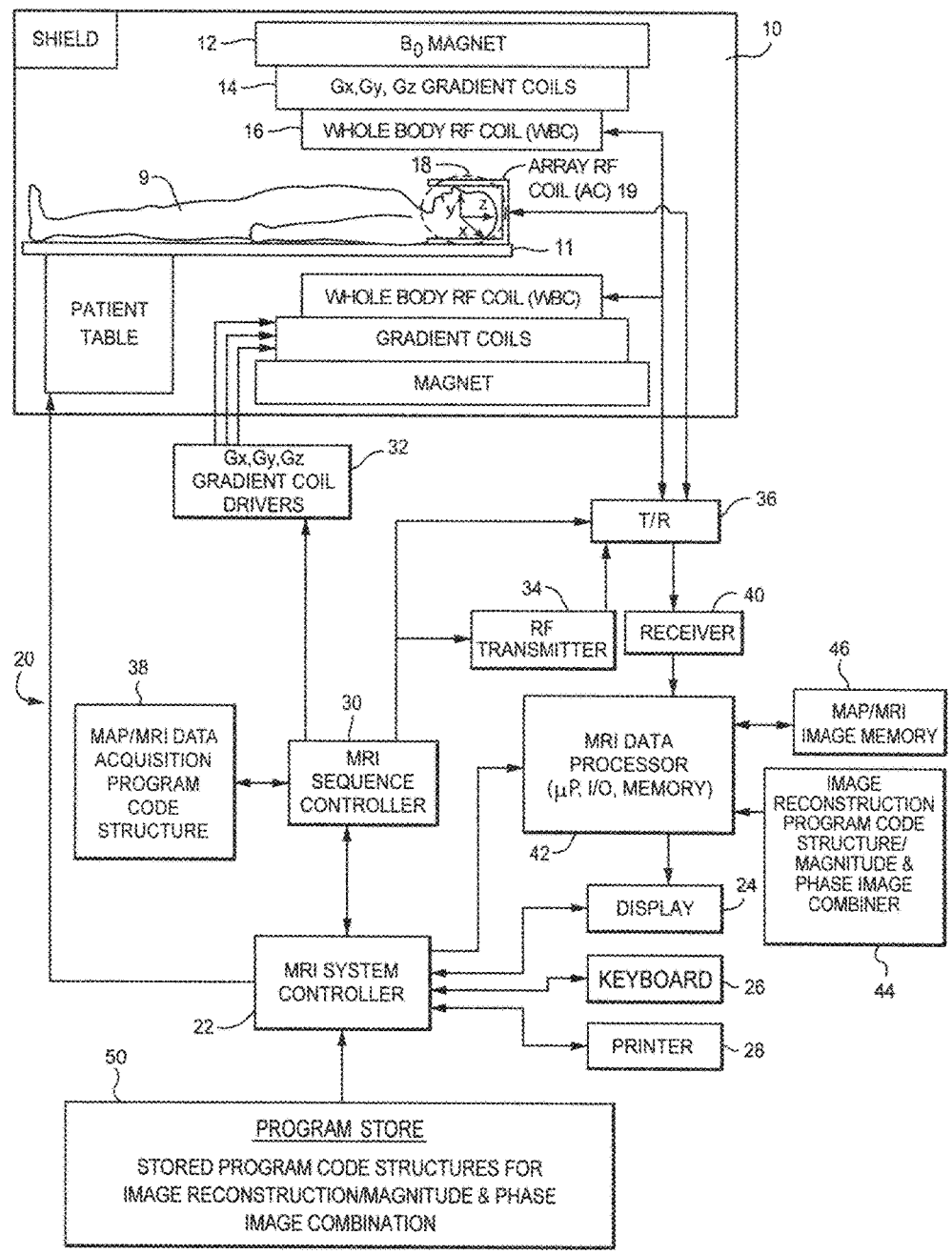
FIG. 1 is a high-level schematic block diagram of an MRI system adapted to provide improved diagnostic capabilities by merging magnitude and phase images, in accordance with one or more embodiments.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body RF coil (WBC) assembly 16. Along the horizontal axis of this cylindrical array of elements is an imaging volume 18 shown as substantially encompassing the head of a patient 9 supported by a patient table 11. One or more smaller array RF coils 19 might be more closely coupled to the patient head in imaging volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and a plurality of receiver coils configured to receive RF signals from an object, such as the patient head in the example above, in the imaging volume.

An MRI system controller 22 has input/output ports connected to a display 24, keyboard 26 and printer 28. As will be appreciated, the display 24 may be of the touchscreen variety so that it provides control inputs as well and a mouse or other I/O device(s) may be provided.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques, which may also include parallel imaging. As described below, sequence controller 30 may be configured to apply a predetermined tagging pulse sequence and a predetermined control pulse sequence, in order to obtain corresponding tagging and control images from which a diagnostic MRI image is obtained. MRI sequence controller 30 may also be configured for EPI imaging and/or parallel imaging. Moreover, MRI sequence controller 30 may facilitate one or more preparation scan (prescan) sequences, and a scan sequence to obtain a main scan MR image (sometimes referred to as a diagnostic image).

The MRI system 20 includes an RF receiver 40 providing input to data processor 42 so as to create processed image data, which is sent to display 24. The MRI data processor 42 is also configured for access to previously generated MR data, images (e.g. magnitude images, phase images etc), and/or maps, and/or system configuration parameters 46, magnitude and phase image combining and MRI image reconstruction program code structures 44 and 50.

Also illustrated in FIG. 1 is a generalized depiction of an MRI system program store 50 where stored program code structures (e.g., for image reconstruction of control and tagging images, for generation of subtracted image, etc. as described below, for simulation of selected MRI image characteristics, for post-processing MRI etc.) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes the generation of a subtracted image from control and tagging images, as described below, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

Embodiments provide a new approach for visualizing both magnitude and phase information simultaneously and without loss of information in either the magnitude image or the phase image. Still further, example embodiments may include an ability to seamlessly "tune" the relative amounts of magnitude image data and phase image data being merged. Embodiments can be used for improved assessment of tissues using all information available in the separate magnitude and phase images.

Phase and magnitude images provide different information regarding tissue. Although the phase and magnitude images can be viewed separately, the large amount of extra phase images requires extra efforts from the radiologists. Consequently, much of the information available in the phase images is not used in clinical diagnosis, except in a few applications such as flow quantification and susceptibility-weighted imaging (SWI).

SWI (see Haacke et al., "Susceptibility-Weighted Imaging: Technical Aspects and Clinical Applications, Part 1," AJNR Am 3 Neuroradiology 30:19-30 (2009)) is a recently developed technique where the phase information is used to enhance the contrast in the magnitude images. SWI attempts to make the phase information more accessible to radiologists by combining the magnitude and phase images and demonstrates important applications in especially the neuroimaging arena. SWI uses the phase information to scale (e.g., multiply) the magnitude images so that the features of interest are emphasized. SWI usually acquires gradient echo images with long echo times (TEs) (e.g. 40-80 ms at 1.5T, 20 ms at 3T) to create susceptibility weighted magnitude images sensitive to local susceptibility changes between tissues. SWI is used with long TEs in order to obtain the desired phase contrast for targeted applications such as, for example, vessel or iron content.

However, although SWI may yield additional contrast etc. in the combined magnitude and phase image relative to the magnitude image, some potentially highly useful information such as the origination of the contrast (i.e., whether the cause for the contrast is in the magnitude image or in the phase image) is lost during the combining process.

Moreover, due to the relatively long echo times (40-80 ms at 1.5T and 20 ms at 3T) used in SWI to create sensitivity to local susceptibility changes between tissues, the short T2/T2* signals are no longer present when the SWI signal is measured. Further, SWI may result in undesirable negative contrast in images, and also be sensitive to signal dropout due to intra-voxel dephasing.

Significant phase variations have also been reported recently in images acquired with ultra-short echo times (e.g., 0.1 microseconds) in a few applications. More recently, phase contrasts have been reported in images acquired with ultra-short TEs (UTE) (or zero TE) in several tissue types. For example, recently it has been discovered that phase images obtained with ultra-short echo times provide important additional contrasts in both knee and lung imaging applications. (See Lu. et al., "MRI of Frozen Tissue Demonstrates a Phase Shift," Magn Reson Med. 66:1582-9 (2011); Carl et al., "Investigations of the Origin of Phase Differences Seen with Ultrashort TE Imaging of Short T2 Meniscal Tissue," Magn Reson Med 67:991-1003 (2012)) This information can be used to add important information to the magnitude images acquired with ultra-short TE/zero TE sequences. Thus, phase images include additional information that can be valuable for achieving accurate diagnosis.

Embodiments provide for the visualization of both phase and magnitude images acquired with all TEs (i.e. not limited to long TEs or ultra short TEs), and represent a new approach to simplify and facilitate the visualization of the magnitude and phase images simultaneously without loss of original phase and magnitude information.

According to some embodiments, the magnitude images and the phase images can be generated using any suitable method. Phase images, for example, may be generated using the actual phase image (e.g., where each pixel of the phase MR image is based on the arctan of the real and imaginary parts of a complex-valued reconstructed MR image pixel) with phase unwrapping (e.g., to remove $2\pi$ ambiguities), or high pass filtered phase images such as that obtained in SWI. The magnitude image (e.g., where each pixel of the magnitude MR image is based on the square root of the sum of the squares of the real and imaginary parts of a complex-valued reconstructed MR image pixel) and phase image are then controllably merged by using them as inputs to different color display channels to create composite color image data. The composite color image data which is generated is then presented on a display screen for visualization. Separate color scale bars etc. may be provided so that the relative display pixel magnitude (brightness), color scale, contrast and the like for each individual color display channel can be adjusted flexibly (i.e. "tuned") to obtain the desired image contrast, for example to emphasize or suppress magnitude or phase information, or to emphasize certain tissue features.

Image reconstruction and processing according to embodiments may provide several benefits when compared to conventional techniques. The benefits may include, for example: providing convenient and flexible techniques and systems for clinical diagnosis of MR imaging using both magnitude and phase information simultaneously and without loss of information from either magnitude images or phase images after the mergence, while in many conventional clinical settings primarily only the magnitude information is used; use of additional important information on tissue structure and properties found to be present in phase images even in the case of MR imaging with ultra-short TE; better visualization of the fat/water pixels and richer image contrast and details in musculoskeletal imaging than magnitude or phase images taken alone. Moreover, some embodiments may provide tools for separately adjusting the color scale and contrast for each individual color display channel to achieve the desired composite image contrast, for example, to emphasize or suppress magnitude or phase information. Further, in contrast to several conventional techniques, embodiments may consistently provide positive contrast and may not require long TE times.

Figure 2:
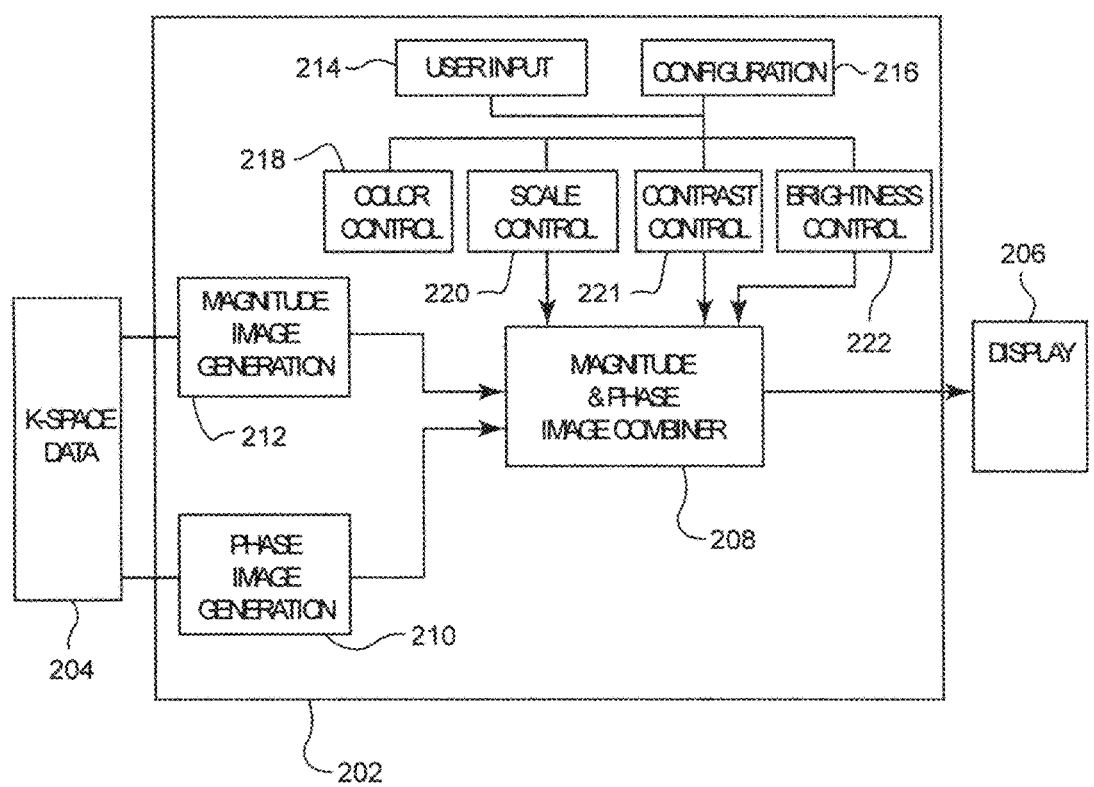
FIG. 2 is a block diagram illustrating a part of the MRI system of FIG. 1 that performs the merging of the magnitude and phase images, according to one or more embodiments.

FIG. 2 is a block diagram 200 illustrating a part of the MRI system of FIG. 1 that performs the merging of the magnitude and phase images, according to one or more embodiments. An MRI image generation engine 202 takes as input, k-space data from an MRI scan stored in a memory 204, and generates one or more composite magnitude and phase images that is then displayed in a display 206.

The k-space data stored in memory 204 may be acquired from an MRI scan of any part of a patient. Memory 204 may include the map/MRI image memory 46 shown in FIG. 1.

Image generation engine 202 includes a magnitude image generator 210 and a phase image generator 212, which respectively generate a magnitude image and a phase image from the k-space data accessed from memory 204.

A magnitude and phase image combiner 208 operates to take, as input, a magnitude image from magnitude image generator 210 and a phase image from a phase image generator 212, and merge the input images into a composite magnitude and phase image which is displayed to the operator (e.g. radiologist).

The merging of magnitude and phase images in combiner 208 may be based upon and/or controlled by one or both of real-time operator input received through user input 214 and pre-configured settings stored in a configuration memory 216.

The operator input and the pre-configuration settings may operate one or more of a color control 218, magnitude and phase image scale control 220, a contrast control 221, and a brightness control 222. The color control module 220 may operate to control assignment of colors to the input magnitude image and/or the phase image. The image scale control 220 controls the contribution including dynamic range of each input image to the composite image. The contrast control 221 controls the contrast between the magnitude image and the phase image. The brightness control 222 controls the brightness of the composite image. Each of 221 and 222 may be adjustable independently for the magnitude image and the phase image.

According to some embodiments, block diagram 200 may represent a standalone computer system (e.g., a computer system that is not part of the MRI system shown in FIG. 1) which may access stored complex-valued MR image data from previously performed MRI scans or even separate magnitude and phase images previously generated from such complex-data in a memory, and from which stored data the computer system generates the displayed composite image.

According to an embodiment, following a scan of a patient, a composite image is initially displayed in accordance with default settings or pre-configured settings. Then, an operator may control the various controllable aspects of the image merging in order to obtain an optimal composite image in which particular clinically interesting aspects are clearly visible and/or is distinguishable in an improved manner when compared to only the magnitude image or only the phase image.

According to an embodiment, a tool, such as, image (see Rasband W. S., "Image," NIH, Bethesda, Md., USA, http://imagej.nih.gov/ij/, 1997-2012) is used for forming the composite image. For example, when using image, the magnitude image data may be assigned to the cyan color display channel and the phase image data may be assigned to the magenta color display channel. Image may be configured to generate a composite display image using the inputs from the cyan color display channel and the magenta color display channel. The magenta and cyan color display channels are presently preferred. However, as those in the art will appreciate, other color channel assignments may also be utilized and such assignment may be optimized for particular anatomies and/or circumstances.

Figure 3:
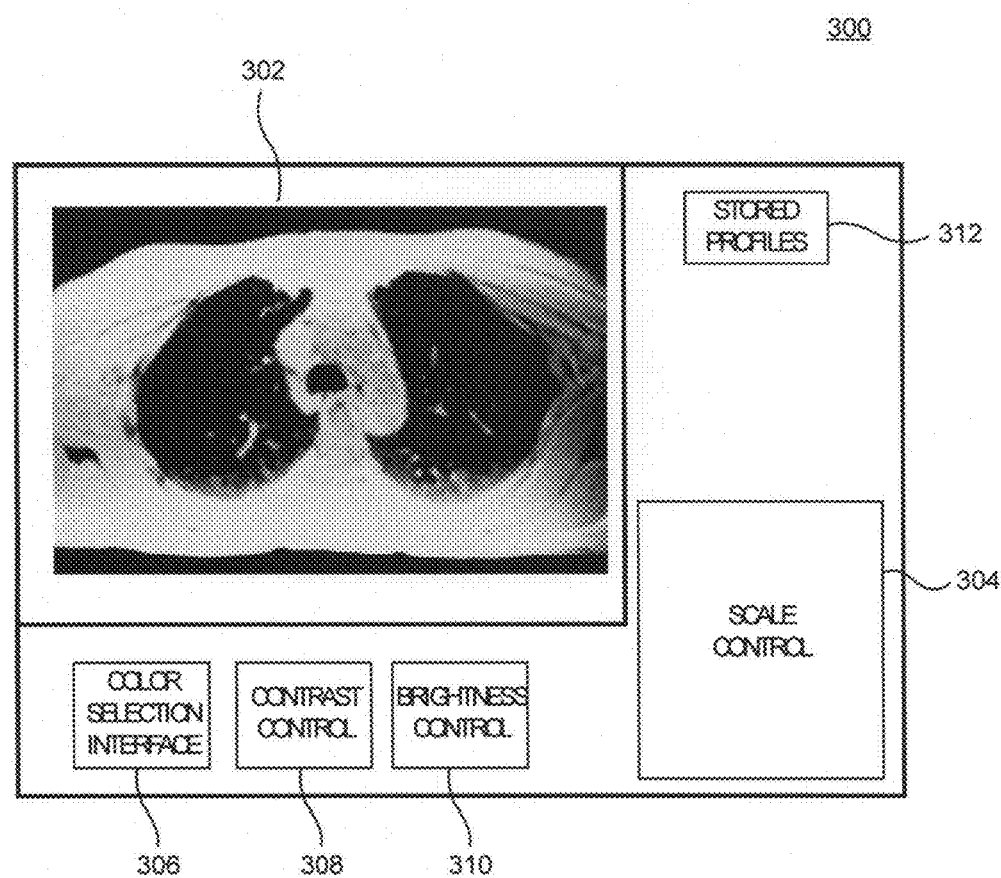
FIG. 3 is a schematic diagram of a user interface for enabling the user to control the merging of magnitude and phase images, in accordance with one or more embodiments.

FIG. 3 is a schematic diagram of a user interface (UI) 300 for enabling the user to control the merging of magnitude and phase images, in accordance with one or more embodiments. According to an embodiment, UI 300 may include a display area 302 in which the composite image is displayed. In some embodiments, display area 302 may be configured to display, in accordance with a user selection, the separate magnitude and phase images, the separate magnitude and phase images and the composite image, the composite image and one of the magnitude or phase image, or only the composite image.

An image scale control interface 304, a color control interface 306, a contrast control interface 308 and a brightness control interface 310 may be manipulated by the operator to adjust aspects of the composite image displayed in display area 301. According to an embodiment, by manipulation of the image scale control interface 304, the color control interface 306, the contrast control interface 308 and the brightness control interface 310, an operator (e.g. user or radiologist) can provide input to, respectively, magnitude and phase image scale control 220, color control 218, contrast control 221, and brightness control 222. Each of the image scale control interface 304, the color control interface 306, the contrast control interface 308 and the brightness control interface 310 may include, for example, one or more of a slider, tunable dial, menu, pull-down menu, text input field, or any other UI component that can be manipulated based upon operator input to represent a changing of the corresponding values.

A selection option for stored profiles 312 may be configured to enable the selection of one or more previously stored configuration profiles, for example, specifying initial values for any of a dynamic range or brightness for the color display channels, or a scaling factor for the color display channels. According to some embodiments, stored profiles directed to particular tissue and/or diagnostic characteristics may be stored for subsequent selection and use.

Figure 4:
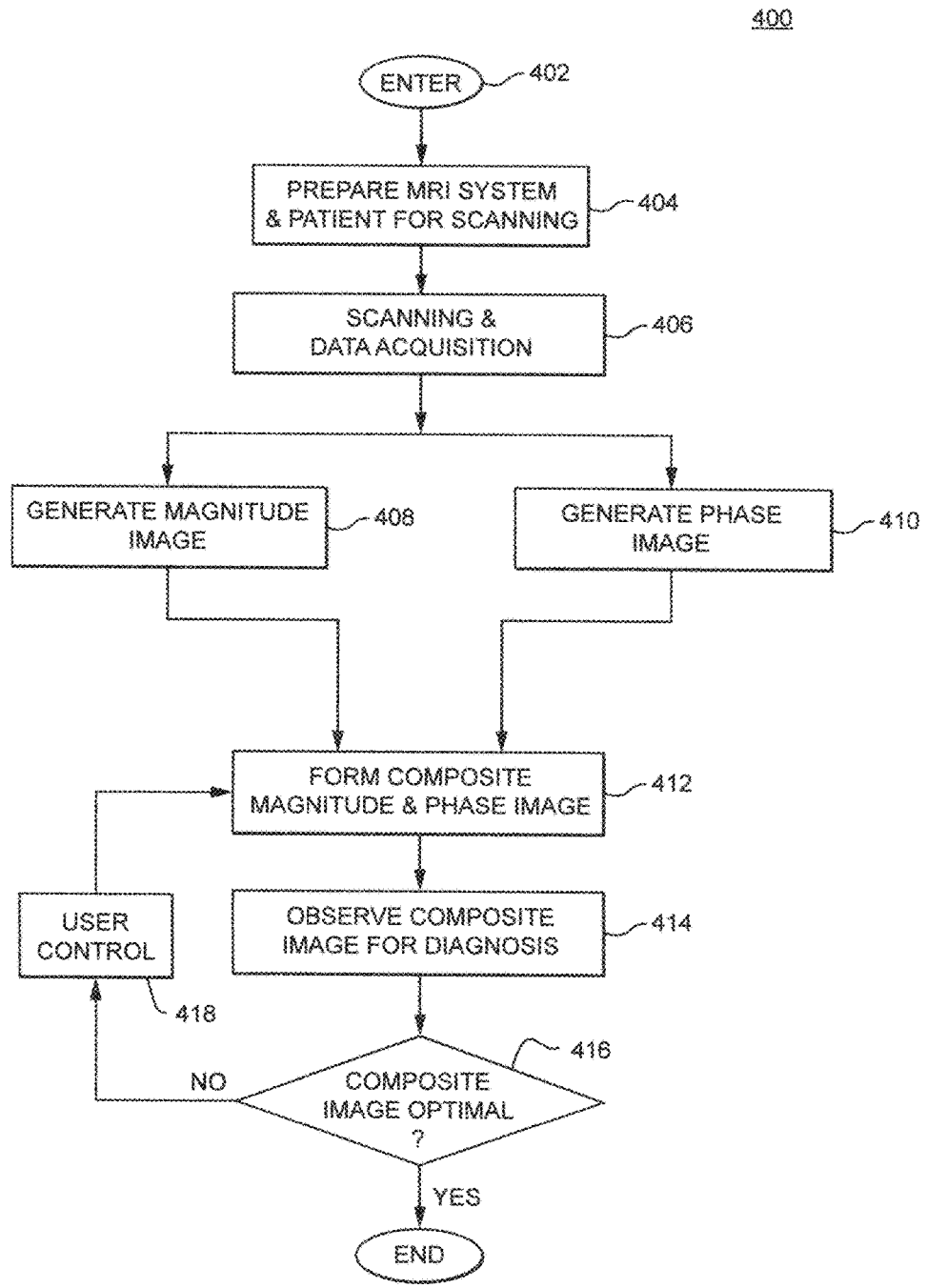
FIG. 4 illustrates a flowchart of a process for merging magnitude and phase images acquired by an MRI system, in accordance with one or more embodiments.

FIG. 4 illustrates a flowchart of a process 400 for merging magnitude and phase images acquired by an MRI system, in accordance with one or more embodiments. According to an embodiment, one or more of the operations 404-418 may not be performed, may be performed in an order other than shown, when performing process 400. Process 400 may be performed for merging a magnitude image and a phase image to display a composite image, for example, in the UI 300 discussed above.

After entering the process 400 at 402, at operation 404 the MRI system and the patient are prepared for scanning. The preparation may include positioning the patient, coil calibration, pre-scans, etc.

At operation 406, an MRI scan is performed, and the magnetic response measurements are used to populate k-space. The scanning may be performed according to a predetermined imaging pulse such as, but not limited to, 2D/3D Field Echo (FE), Fast Field Echo (FFE), Balanced Steady State Free Precision (bSSFP), Ultra-short Echo Time (UTE), etc, imaging pulse sequences. According to an embodiment the measured k-space data is stored as complex image data after the application of the Fourier transform. The Fourier transform may be preceded by gridding. In some embodiments, actual k-space trajectories on the three orthogonal axes are measured and used to correct for gradient system imperfections such as eddy currents.

At operation 408, a magnitude image is generated from the k-space data. Magnitude images, as referred to herein, are the real and the imaginary parts combined, calculated after the Fourier transform is applied as $\sqrt{(R^2+I^2)}$ where R is the real component and I is the imaginary component, for the complex data point at each image pixel. Any appropriate reconstruction technique may be used to form the magnitude image. According to an embodiment, the magnitude image is created in a conventional way.

Figure 5:
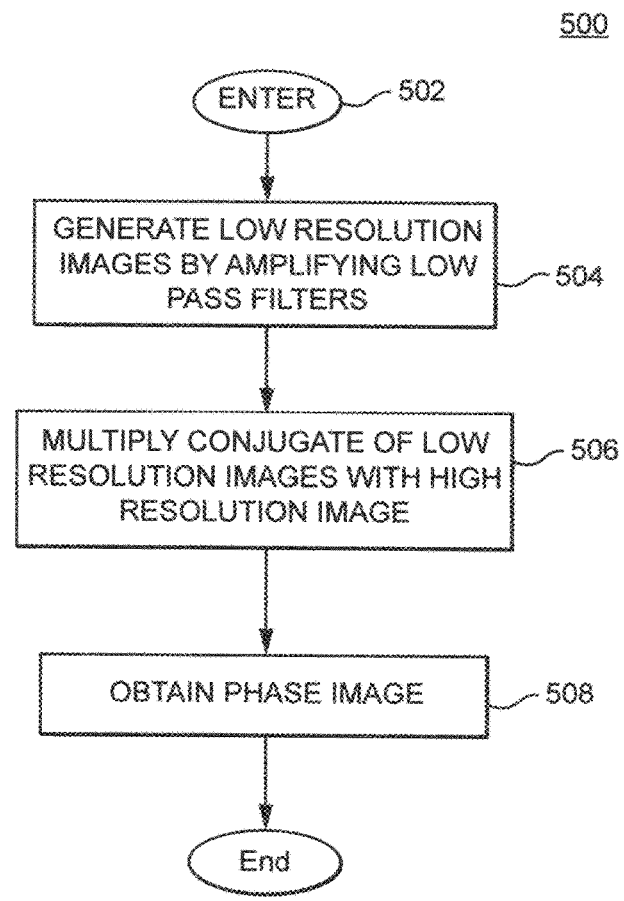
FIG. 5 illustrates a flowchart of a process for generating phase images, in accordance with one or more embodiments.

At operation 410, a phase image is generated from the k-space data. The phase image is calculated after the Fourier transform as $\tan^{-1}(I/R)$ for the complex data point at each image pixel. Phase is also known as the complex argument of a complex number. The phase image reconstruction may be performed in accordance with any suitable reconstruction technique. According to some embodiments, phase images are reconstructed after removing field inhomogeneities and phase wraps. FIG. 5 below illustrates a technique to form the phase image in accordance with an embodiment.

At operation 412, a composite magnitude and phase image is formed using the separate magnitude image and the phase image. The composite image, according to an embodiment, is a composite color image obtained by merging the magnitude image received on a first color display channel and the phase image received on a second color display channel. The corresponding magnitude and phase images can be used as inputs to different color display channels (e.g., magnitude image assigned cyan channel, phase image assigned to magenta channel) to create composite color images. The assignment of color display channels, of course, may be flexible and operator-controlled. The color display channels may comprise respective channels of a color model such as, but not limited to, CMYK, RGB or other color model. Although having different colors for the first and second color display channels is preferred, in some embodiments, the first color display channel and the second color display channel both may display the same color. For example, the first and second display channels may both be configured for grayscale or any other single color. However, when the same color is assigned to the first and the second display channels, the operator may lose the ability to distinguish between aspects of the composite image caused by the magnitude image and aspects caused by the phase image.

The color scale (e.g. proportion) and/or contrast (e.g., dynamic range) for each individual color display channel may be adjusted separately (i.e. independently) to achieve the composite image contrast, for example to emphasize or suppress magnitude or phase information of certain tissue types. In some embodiments, other parameters that affect the composite color image, such as, for example, brightness may be configured. Moreover, the color display channels may be individually configured, or configured as a pair. For example, in an embodiment in which the composite image is based upon two color display channels, adjusting the scaling of the first channel to a first percentage (e.g., 60%) can automatically adjust the second channel scaling (e.g., 40%).

The dynamic range and contrast for each individual color display channel can be adjusted independently to achieve the desired composite image contrast. For example, the operator may adjust the dynamic range of one or both the magnitude image and the phase image in order to achieve an optimal contrast. Similarly brightness of one or both the magnitude image and the phase image can be adjusted independently.

The color composite may be based upon any color composition technique, including standard color composite techniques such as linear stretching and histogram equalization. Other color composition techniques may include, for example, on a pixel-by-pixel basis (i.e., for each pixel in the composite image) adding corresponding pixels, subtracting one pixel from another, or other combination technique.

At operation 414, an operator may observe the formed composite color image. For example, the formed composite image alone, or the formed composite image and one or both of the magnitude and phase images, may be displayed in a UI, such as UI 300, for viewing by an operator/radiologist.

At operation 416, if the composite image is not satisfactory, the operator may, at operation 418, reconfigure one or more user controls to improve the composite image. Operations 412-416 may be repeated each time the merging of the magnitude image and phase image is affected by user controls. According to some embodiments, at operation 418, the user may manipulate one or more of the image scale control interface 304, the color control interface 306, the contrast control interface 308 and the brightness control interface 310 to control the merging of the magnitude and phase images.

The user controls may be provided in a UI which provides for the convenient assessment and visualization of tissue features by operators. The UI may be configured to display the composite color images and tools to adjust the color scale and contrast for each individual color display channel to achieve the desired composite image contrast. In some embodiments the UI may also provide for displaying the magnitude and/or phase images. The UI may include scale of color control for better visualization of each characteristic. UI contains bars to control the dynamic range of both phase and magnitude to achieve the desired contrast for the tissue feature of interest. For example, appropriate dynamic ranges of the magnitude and phase channels may allow one to see not only the different types of bone, but also bone density difference. An example UI is illustrated in FIG. 3.

Figure 6:
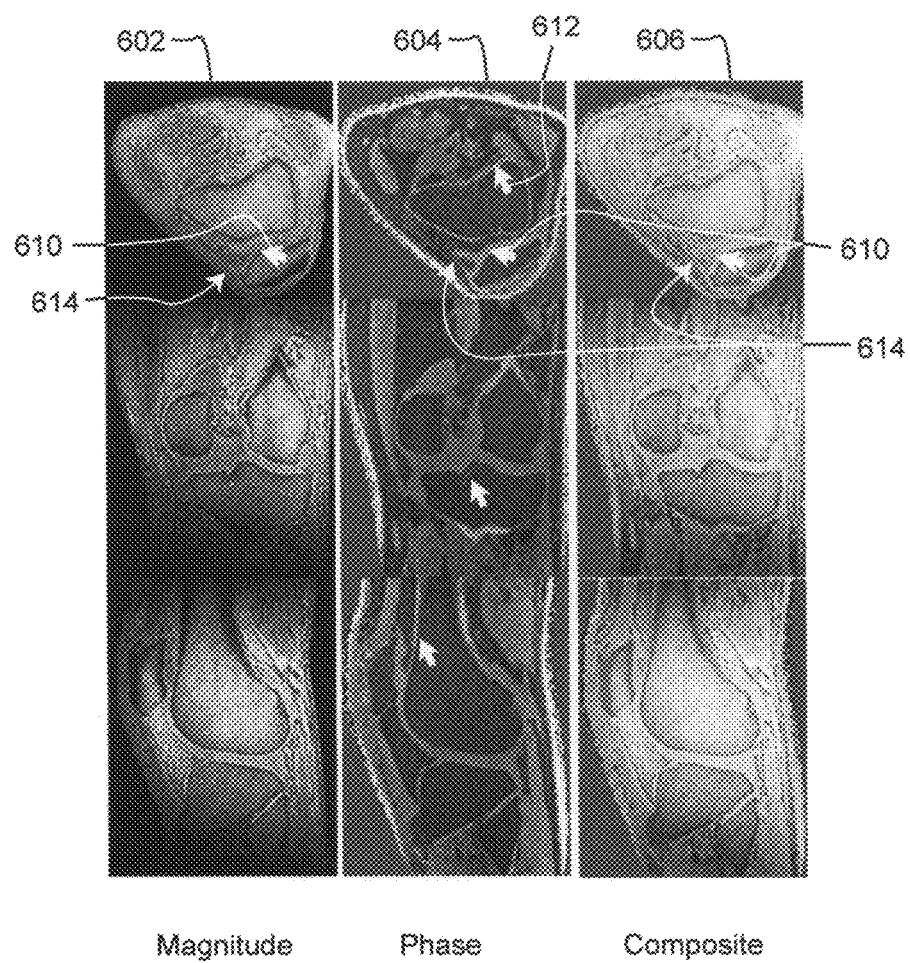
FIG. 6 illustrates example magnitude, phase and composite images of a knee area, according to one or more embodiments.
Figure 7:
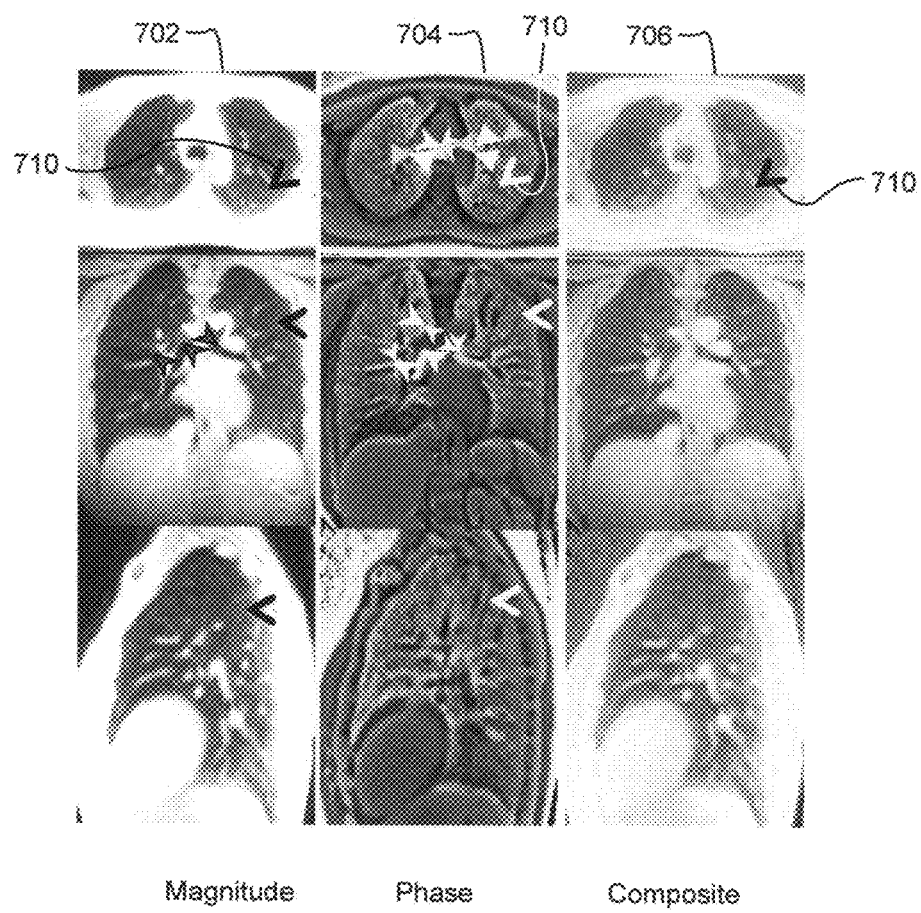
FIG. 7 illustrates example magnitude, phase and composite images of a lung area, according to one or more embodiments.

At operation 416, if the composite image is satisfactory to the operator, process 400 is ended. According to an embodiment, the determination whether the composite image is satisfactory is based upon whether the operator can visually discriminate certain clinical diagnostic aspects in the composite image. For example, certain clinical aspects that are not visually distinguishable with sufficient clarity in either of the separate magnitude or phase images may be distinguishable in the composite image. Examples are shown in FIGS. 6 and 7. In some embodiments, the determination of whether the composite image is satisfactory or not may be automated. For example, the determination may be made based upon an automatic image analysis is able to delineate a defined clinical feature in an image.

FIG. 5 illustrates a flowchart of a process 500 for generating phase images, in accordance with one or more embodiments. According to an embodiment, one or more of the operations 504-508 may not be performed, may be performed in an order other than shown, when performing process 500. Process 500 may be performed for generating the phase image for example, for use in process 400 discussed above.

After entering the process at 502, at operation 504, one or more low resolution images are generated. According to an embodiment, for example, the phase images can be generated by reconstructing a low-resolution image by low-pass filtering the same k-space data before image reconstruction.

At operation 506, the conjugate of the low resolution phase image is multiplied by the high resolution image. The desired phase images are then generated from the phase of the resultant image, or $\exp(i*(\Phi_h-\Phi_l))$, where $\Phi_h$ represent phases of the full resolution images obtained simultaneously with the magnitude image, while $\Phi_l$ represent the phase of the low resolution image.

At operation 508, the phase image to be used in the merging is obtained based upon the calculation in operation 506.

FIGS. 6 and 7 respectively illustrate example knee and lung MRI scans formed according to some embodiments.

The imaging experiments were performed using a 3D radial UTE sequence implemented in a spoiled gradient echo mode on a Toshiba Vantage Titan 3T scanner (Otawara, Japan). Common acquisition parameters include: FA=5°, equivalent readout matrix 424×424×424, ADC pitch time=4 µs, TE/TR=0.19 ms/5.0 ms. For knee imaging, 76800 radial lines were sampled in 6'24" and the image resolution was 0.63 mm isotropic. For lung imaging, 38400 radial lines were sampled with respiratory gating in 7'24". The image resolution was 1.18 mm isotropic. No contrast agent was administrated.

Figure 8:
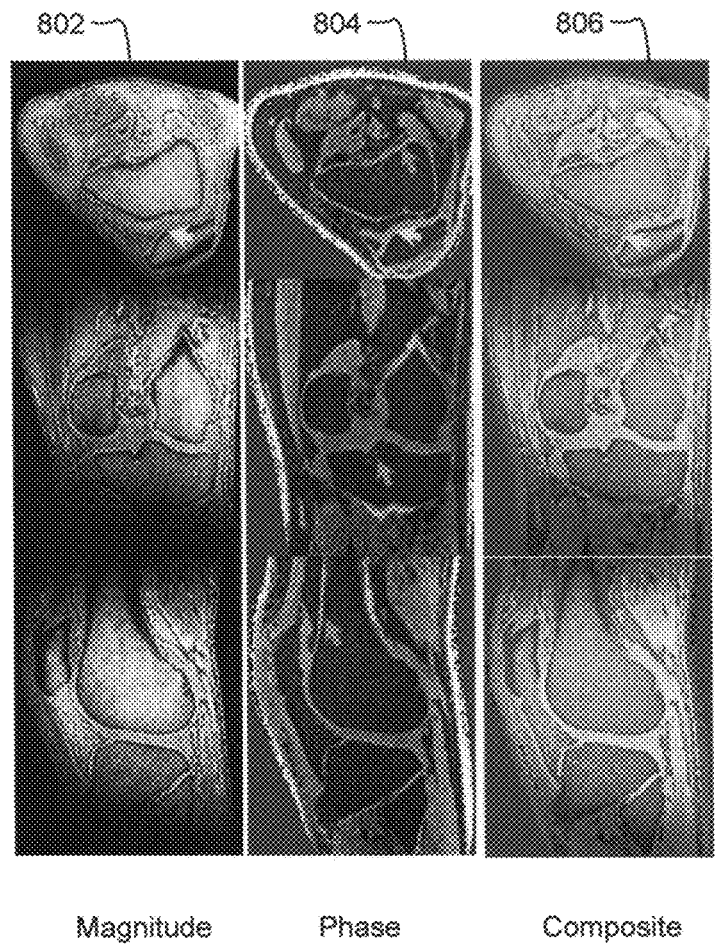
FIG. 8 is a color illustration of the same MRI images shown in FIG. 6.

FIG. 6 illustrates example magnitude 602, phase 604 and composite 606 images of a knee area, according to one or more embodiments. Knee cartilages are depicted in great detail in all images. The magnitude images 602 show slightly brighter fat signal than muscle. The visualization of the cartilage is obscured by the fat signal (see location marked by arrow head 610). Despite the relatively flat contrast, the phase images 604 show good differentiation between fat (dark) and water (gray) signals and better visualization of some structural features (see locations marked by short arrows such as 612). The composite images 606 allow easier (e.g. better or more distinct) visualization of details from both magnitude 602 and phase 604 images simultaneously. For example, differentiation of fat/water-dominant voxels is improved, which enables better visualization of the cartilage (e.g. locations marked by arrow heads 610) and synovial fluid (e.g. locations marked by long arrows 614) as compared to the magnitude images 602. FIG. 8 is a color illustration of the same magnitude (802 and 602), phase (804 and 604) and composite (806 and 606) images shown in FIG. 6.

Figure 9:
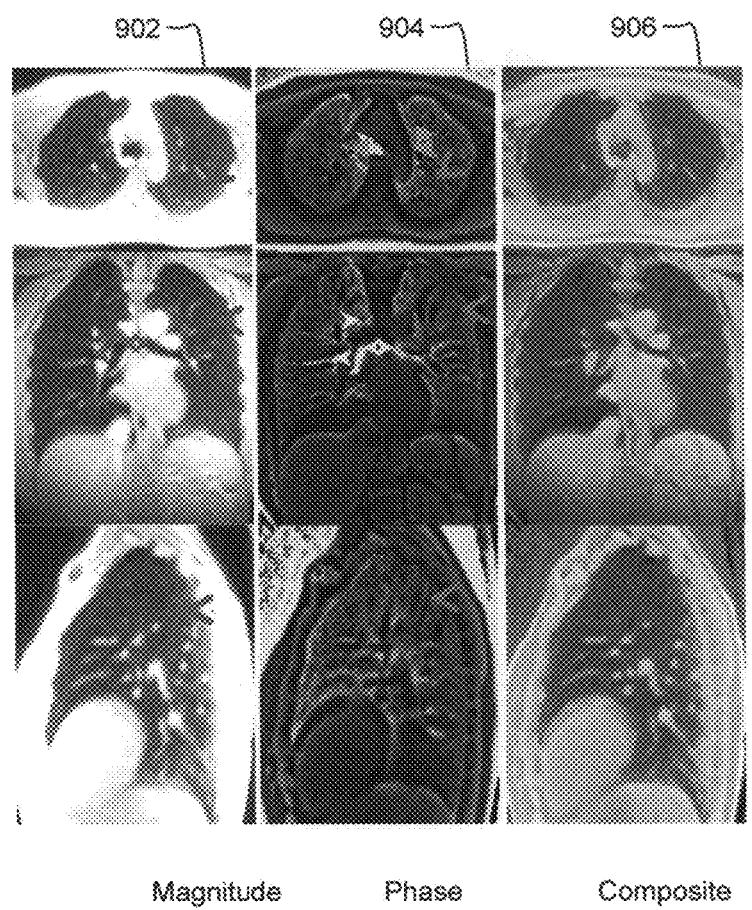
FIG. 9 is a color illustration of the same MRI images shown in FIG. 7.

FIG. 7 illustrates example magnitude 702, phase 704 and composite 706 images of a lung area, according to one or more embodiments. The magnitude images 702 depict the lung parenchyma, large fissures (e.g. location marked by arrow 710 in magnitude image 702) and vessels due to the ultra-short TE used. Phase images 704 show very different contrasts and provide complementary information to the magnitude images 702. Some vessel walls are clearly visualized as the blood signals within them appear dark. The airways are shown with positive contrast likely due to the presence of tissues such as cricoid cartilage. Phase images 704 also show excellent visualization of the lung parenchyma. Large fissures are visible in the phase images 704 with negative contrast (e.g. location marked by arrow 710 in phase image 704). Again, the composite images 706 show details from both magnitude 702 and phase 704 images. Lung parenchyma is readily visualized (e.g. location marked by arrow 710 in composite image 706) and vessels with different phase behaviors are shown in different color. FIG. 9 is a color illustration of the same magnitude (902 and 702), phase (904 and 704) and composite (906 and 706) images shown in FIG. 7.

Significant phase differences have been demonstrated in human knee and lung images acquired with a UTE sequence, which provide important information for accessing tissue characteristics. The fusion of magnitude and phase images into composite images enables easy visualization of magnitude and phase information simultaneously, which can widen the usage of MR phase information in a clinical setting.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A system for displaying a composite magnetic resonance (MR) image of a patient wherein a magnitude MR image and a phase MR image are combined into a composite colored display image that simultaneously visualizes both magnitude and phase information without loss of magnitude or phase image information, said system comprising:
    a memory configured to store a magnitude MR image and a phase MR image having pixel values based on complex-valued MR image data corresponding to nuclear magnetic resonance (NMR) signals received in response to a radio frequency (RF) and magnetic gradient pulse sequence applied to the patient during a magnetic resonance imaging (MRI) scan; and
    at least one digital data processor system configured to access said memory and:
        change pixel values of the magnitude MR image to represent a first display color;
        change pixel values of the phase MR image to represent a second display color, different than said first display color; and
        generate and display a composite display image of the magnitude and phase MR images by generating and displaying composite display image pixel values representing a combination of said first and second display colors wherein the magnitude MR image and the phase MR image are combined into a composite colored display image that simultaneously visualizes both magnitude and phase information without loss of magnitude or phase image information present in the magnitude MR image and the phase MR image.

2. The system according to claim 1, wherein said first display color is a cyan color and said second display color is a magenta color.

3. The system according to claim 1, wherein the at least one digital data processor system is further configured to cause the composite image to be separately displayed concurrently with the magnitude MR image and/or the phase MR image.

4. The system according to claim 1, wherein a dynamic range for the first display color and a dynamic range for the second display color are independently controllable by a user.

5. The system according to claim 1, wherein brightness for the first display color and brightness for the second display color are independently controllable by a user.

6. The system according to claim 1, wherein generating said composite display image comprises generating respective pixel values in the composite image as first scaled values of corresponding changed pixel values in the magnitude MR image and second scaled values of a corresponding changed pixel values in the phase MR image, wherein the first and second scaled values are determined respectively according to first and second scale factors.

7. The system according to claim 6, wherein the first scale factor and the second scale factor are controllable by a user.

8. The system according to claim 1, wherein said first display color and said second display color are controllable by a user.

9. The system according to claim 1, wherein the RF and magnetic gradient pulse sequence used to create said complex-valued MR image data includes an ultra-short TE (UTE) sequence.

10. The system according to claim 1, wherein said composite image is again generated and displayed after a change has been made to at least one of:
(a) a dynamic range of the first display color or the second display color, or
(b) a brightness of the first display color or the second display color, or
(c) a scaling of the first display color or a scaling of the second display color.

11. The system according to claim 1, wherein generating said composite image comprises:
determining a first scaling factor for the first display color and a second scaling factor for the second display color, wherein the first and second scaling factors are different; and
determining, for each pixel in the composite image, a respective display color value based upon (a) a corresponding pixel from the first display color of the magnitude MR image scaled according to the first scaling factor and (b) a corresponding pixel from the second display color of the phase MR image scaled according to the second scaling factor.

12. The system according to claim 1, wherein the digital data processor system is further configured to:
reconstruct the magnitude MR image and the phase MR image from complex-valued MR image data; and
store the magnitude MR image and the phase MR image in the memory.

13. A machine-implemented process for displaying a composite magnetic resonance (MR) image of a patient wherein a magnitude MR image and a phase MR image are combined into a composite colored display image that simultaneously visualizes both magnitude and phase information without loss of magnitude or phase image information, said machine-implemented process comprising:
accessing, using at least one digital data processor, a magnitude MR image and a phase MR image, wherein the magnitude MR image and the phase MR image have pixel values based on complex-valued MR image data corresponding to nuclear magnetic resonance (NMR) signals received in response to a radio frequency (RF) and magnetic gradient pulse sequence applied to the patient during a magnetic resonance imaging (MRI) scan;
changing pixel values of the magnitude MR image, using at least one digital data processor, to first display color values and changing pixel values of the phase MR image, using at least one digital data processor, to second display color values, different than said first display color; and
generating and displaying, using at least one digital data processor, a composite display image of the magnitude and phase MR images by generating and displaying composite display image pixel values representing a combination of said first and second display colors wherein the magnitude MR image and the phase MR image are combined into a composite colored display image that simultaneously visualizes both magnitude and phase information without loss of magnitude or phase image information present in the magnitude MR image and the phase MR image.

14. The machine-implemented process according to claim 13, wherein said first display color is a cyan color and said second display color is a magenta color.

15. A non-transitory computer-readable storage medium storing thereon machine-executable instructions that, when executed by at least one digital data processor, causes display of a composite magnetic resonance (MR) image of a patient wherein a magnitude MR image and a phase MR image are combined into a composite colored display image that simultaneously visualizes both magnitude and phase information without loss of magnitude or phase image information by performing machine-implemented processes comprising:
accessing a magnitude MR image and a phase MR image, wherein the magnitude MR image and the phase MR image have pixel values based on complex-valued MR image data corresponding to nuclear magnetic resonance (NMR) signals received in response to a radio frequency (RF) and magnetic gradient pulse sequence applied to the patient during a magnetic resonance imaging (MRI) scan;
changing pixel values of the magnitude MR image to represent a first display color and changing pixel values of the phase MR image to represent a second display color that is different than said first display color; and
generating and displaying a composite display image of the magnitude and phase MR images by generating and displaying composite display image pixel values representing a combination of said first and second display colors wherein the magnitude MR image and the phase MR image are combined into a composite colored display image that simultaneously visualizes both magnitude and phase information without loss of magnitude or phase image information present in the magnitude MR image and the phase MR image.

16. A magnetic resonance imaging (MRI) system, said MRI system comprising:
an MRI gantry including a static magnetic field generator, gradient magnetic field generators, and at least one radio frequency (RF) coil configured to couple with an object located in an imaging volume;
an MRI sequence controller coupled to MRI gantry components and configured to effect an RF and magnetic gradient pulse sequence comprising an MR imaging pulse train to the imaging volume; and
at least one digital data processor system configured to:
receive digital data corresponding to nuclear magnetic resonance (NMR) signals responsive to the MR imaging pulse train;
form a magnitude MR image and a phase MR image based upon the received digital data;
change pixel values of the magnitude MR image to represent a first display color;
change pixel values of the phase MR image to represent a second display color that is different than said first display color; and
generate and display a composite display image of the magnitude and phase MR images by generating and displaying composite display image pixel values representing a combination of said first and second display colors wherein the magnitude MR image and the phase MR image are combined into a composite colored display image that simultaneously visualizes both magnitude and phase information without loss of magnitude or phase image information present in the magnitude MR image and the phase MR image.

* * * * *